(12) United States Patent
Huemoeller et al.

(10) Patent No.: US 9,048,298 B1
(45) Date of Patent: Jun. 2, 2015

(54) BACKSIDE WARPAGE CONTROL STRUCTURE AND FABRICATION METHOD

(75) Inventors: Ronald Patrick Huemoeller, Gilbert, AZ (US); Michael Kelly, Queen Creek, AZ (US); David Jon Hiner, Chandler, AZ (US)

(73) Assignee: Amkor Technology, Inc.

( * ) Notice: Subject to any disclaimer, the term of this patent is extended or adjusted under 35 U.S.C. 154(b) by 0 days.

(21) Appl. No.: 13/434,217

(22) Filed: Mar. 29, 2012

(51) Int. Cl.
| | |
|---|---|
| H01L 23/42 | (2006.01) |
| H01L 23/52 | (2006.01) |
| H01L 29/40 | (2006.01) |
| H01L 23/495 | (2006.01) |
| H01L 21/44 | (2006.01) |
| H01L 21/768 | (2006.01) |
| H01L 21/48 | (2006.01) |
| H01L 23/498 | (2006.01) |

(52) U.S. Cl.
CPC ........ H01L 21/76898 (2013.01); H01L 21/486 (2013.01); H01L 23/49838 (2013.01)

(58) Field of Classification Search
CPC ............ H01L 21/76898; H01L 21/486; H01L 23/49838
USPC .......... 257/774, 666, 674, E23.011, E23.067; 438/123, 667
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

Kim et al., "Application of Through Mold Via (TMV) as PoP base package", 58th ECTC Proceedings, May 2008, Lake Buena Vista, FL, 6 pages, IEEE.

(Continued)

Primary Examiner — Fernando L. Toledo
Assistant Examiner — Aaron Gray
(74) Attorney, Agent, or Firm — McAndrews, Held & Malloy, Ltd.

(57) ABSTRACT

Through vias extend through a substrate between a frontside surface and a backside surface, the through vias comprising active surface ends at the frontside surface. A frontside redistribution structure is coupled to the active surface ends, the frontside redistribution structure exerting force on the frontside surface, e.g., due to a difference in the thermal coefficient of expansion (TCE) between the frontside redistribution structure and the substrate. To prevent warpage of the substrate, a backside warpage control structure is coupled to the backside surface of the substrate. The backside warpage control structure exerts an equal but opposite force to the force exerted by the frontside redistribution structure thus avoiding warpage of the substrate.

20 Claims, 9 Drawing Sheets

(56) References Cited

U.S. PATENT DOCUMENTS

| | | |
|---|---|---|
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,647 A | 7/1993 | Gnadinger |
| 5,245,751 A | 9/1993 | Locke et al. |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,303 A | 2/1995 | Yamaji |
| 5,406,124 A | 4/1995 | Morita et al. |
| 5,410,180 A | 4/1995 | Fuji et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,576,517 A | 11/1996 | Wojnarowski et al. |
| 5,578,525 A | 11/1996 | Mizukoshi |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,264 A | 3/1997 | Gaul |
| 5,608,265 A | 3/1997 | Kitano et al. |
| 5,608,267 A | 3/1997 | Mahulikar et al. |
| 5,619,068 A | 4/1997 | Benzoni |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,776,798 A | 7/1998 | Quan et al. |
| 5,783,861 A | 7/1998 | Son |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger |
| 5,844,306 A | 12/1998 | Fujita et al. |
| 5,856,911 A | 1/1999 | Riley |
| 5,859,471 A | 1/1999 | Kuraishi et al. |
| 5,859,475 A | 1/1999 | Freyman et al. |

(56) References Cited

U.S. PATENT DOCUMENTS

| | | |
|---|---|---|
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,937,324 A | 8/1999 | Abercrombie et al. |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,168,969 B1 | 1/2001 | Farnworth |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,365,974 B1 | 4/2002 | Abbott et al. |
| 6,369,447 B2 | 4/2002 | Mori |
| 6,369,454 B1 | 4/2002 | Chung |
| 6,373,127 B1 | 4/2002 | Baudouin et al. |
| 6,379,982 B1 | 4/2002 | Ahn et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,406,934 B1 | 6/2002 | Glenn et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 | 9/2002 | Kim et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 | 2/2003 | Peters et al. |
| 6,524,885 B2 | 2/2003 | Pierce |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |

(56) References Cited

U.S. PATENT DOCUMENTS

| | | | |
|---|---|---|---|
| 6,573,461 B2 | 6/2003 | Roeters et al. |
| 6,577,013 B1 | 6/2003 | Glenn et al. |
| 6,583,503 B2 | 6/2003 | Akram et al. |
| 6,593,645 B2 | 7/2003 | Shih et al. |
| 6,603,196 B2 | 8/2003 | Lee et al. |
| 6,608,371 B2 | 8/2003 | Kurashima et al. |
| 6,624,005 B1 | 9/2003 | DiCaprio et al. |
| 6,667,546 B2 | 12/2003 | Huang et al. |
| 6,671,398 B2 | 12/2003 | Reinhorn et al. |
| 6,727,576 B2 | 4/2004 | Hedler et al. |
| 6,730,857 B2 | 5/2004 | Konrad et al. |
| 6,740,964 B2 | 5/2004 | Sasaki |
| 6,780,770 B2 | 8/2004 | Larson |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,572 B2 | 2/2005 | Sabharwal |
| 6,873,054 B2 | 3/2005 | Miyazawa et al. |
| 6,905,914 B1 | 6/2005 | Huemoeller et al. |
| 6,919,514 B2 | 7/2005 | Konrad et al. |
| 6,921,975 B2 | 7/2005 | Leal et al. |
| 6,930,256 B1 | 8/2005 | Huemoeller et al. |
| 7,015,075 B2 | 3/2006 | Fay et al. |
| 7,022,609 B2 | 4/2006 | Yamamoto et al. |
| 7,041,534 B2 | 5/2006 | Chao et al. |
| 7,129,158 B2 | 10/2006 | Nakai |
| 7,151,009 B2 | 12/2006 | Kim et al. |
| 7,190,062 B1 | 3/2007 | Sheridan et al. |
| 7,192,807 B1 | 3/2007 | Huemoeller et al. |
| 7,208,838 B2 | 4/2007 | Masuda |
| 7,223,634 B2 | 5/2007 | Yamaguchi |
| 7,242,081 B1 | 7/2007 | Lee |
| 7,247,523 B1 | 7/2007 | Huemoeller et al. |
| 7,272,444 B2 | 9/2007 | Peterson et al. |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,572,681 B1 | 8/2009 | Huemoeller et al. |
| 7,632,753 B1 | 12/2009 | Rusli et al. |
| 7,692,286 B1 | 4/2010 | Huemoeller et al. |
| 7,714,431 B1 | 5/2010 | Huemoeller et al. |
| 7,723,210 B2 | 5/2010 | Berry et al. |
| 7,777,351 B1 | 8/2010 | Berry et al. |
| 7,800,138 B2 | 9/2010 | Baek et al. |
| 7,843,052 B1 | 11/2010 | Yoo et al. |
| 7,843,072 B1 | 11/2010 | Park et al. |
| 7,902,660 B1 | 3/2011 | Lee et al. |
| 7,932,595 B1 | 4/2011 | Huemoeller et al. |
| 7,977,163 B1 | 7/2011 | Huemoeller et al. |
| 8,188,584 B1 | 5/2012 | Berry et al. |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017710 A1 | 2/2002 | Kurashima et al. |
| 2002/0024122 A1 | 2/2002 | Jung et al. |
| 2002/0027297 A1 | 3/2002 | Ikenaga et al. |
| 2002/0030245 A1 | 3/2002 | Hanaoka et al. |
| 2002/0061642 A1 | 5/2002 | Haji et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0038344 A1 | 2/2003 | Palmer et al. |
| 2003/0064548 A1 | 4/2003 | Isaak |
| 2003/0073265 A1 | 4/2003 | Hu et al. |
| 2003/0134455 A1 | 7/2003 | Cheng et al. |
| 2003/0207566 A1 | 11/2003 | Forbes et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0192033 A1 | 9/2004 | Hara |
| 2004/0251554 A1 | 12/2004 | Masuda |
| 2005/0029630 A1 | 2/2005 | Matsuo |
| 2005/0046002 A1 | 3/2005 | Lee et al. |
| 2005/0104181 A1 | 5/2005 | Lee et al. |
| 2005/0242425 A1 | 11/2005 | Leal et al. |
| 2005/0263869 A1 | 12/2005 | Tanaka et al. |
| 2005/0282314 A1 | 12/2005 | Lo et al. |
| 2007/0007639 A1 | 1/2007 | Fukazawa |
| 2007/0273049 A1 | 11/2007 | Khan et al. |
| 2007/0290376 A1 | 12/2007 | Zhao et al. |
| 2008/0230887 A1 | 9/2008 | Sun et al. |
| 2008/0277799 A1 | 11/2008 | Benson et al. |
| 2009/0020865 A1 | 1/2009 | Su |
| 2009/0039527 A1 | 2/2009 | Chan et al. |
| 2010/0008058 A1 | 1/2010 | Saen et al. |
| 2010/0109142 A1* | 5/2010 | Toh et al. ............... 257/690 |
| 2011/0207322 A1* | 8/2011 | Yamaguchi ............. 438/667 |
| 2012/0018868 A1 | 1/2012 | Oganesian et al. |
| 2012/0068359 A1* | 3/2012 | Mori et al. ............. 257/774 |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |

(56) References Cited

FOREIGN PATENT DOCUMENTS

| | | |
|---|---|---|
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |
| WO | WO 2010134511 A1 * | 11/2010 |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Dunlap et al., "Thin Stackable Package and Method", U.S. Appl. No. 12/630,586, filed Dec. 3, 2009.

Huemoeller et al., "Through Via Nub Reveal Method and Structure", U.S. Appl. No. 12/754,837, filed Apr. 6, 2010.

Fuentes et al., "Shielded Electronic Component Package and Method", U.S. Appl. No. 12/779,784, filed May 13, 2010.

Hiner et al., "Through Via Connected Backside Embedded Circuit Features Structure and Method", U.S. Appl. No. 12/848,820, filed Aug. 2, 2010.

Do et al., "Semiconductor Device and Manufacturing Method Thereof", U.S. Appl. No. 12/898,192, filed Oct. 5, 2010.

Fuentes et al., "Integrated Passive Device Structure and Method", U.S. Appl. No. 12/959,851, filed Dec. 3, 2010.

Hiner et al., "Through Via Recessed Reveal Structure and Method", U.S. Appl. No. 12/985,888, filed Jan. 6, 2011.

* cited by examiner

Backside warpage control structure fabrication method 100

BACKSIDE WARPAGE CONTROL STRUCTURE AND FABRICATION METHOD

TECHNICAL FIELD

The present application relates to the field of electronics, and more particularly, to methods of forming electronic component packages and related structures.

BACKGROUND

In a typical Wafer Level Chip Scale Package (WLCSP), the pattern of bond pads on the active surface of an electronic component is redistributed to a pattern of frontside terminals for electrical connection to other structures. This frontside redistribution structure includes a circuit pattern and a plurality of dielectric layers on the active surface of the electronic component.

However, the frontside redistribution structure has a thermal coefficient of expansion (TCE) different than the silicon of the electronic component. This mismatch in TCEs causes the frontside redistribution structure to exert stress on the electronic component. This stress, in turn, causes undesirable warpage of the electronic component.

BRIEF DESCRIPTION OF THE DRAWINGS

In the following description, the same or similar elements are labeled with the same or similar reference numbers.

DETAILED DESCRIPTION

Figure 5:
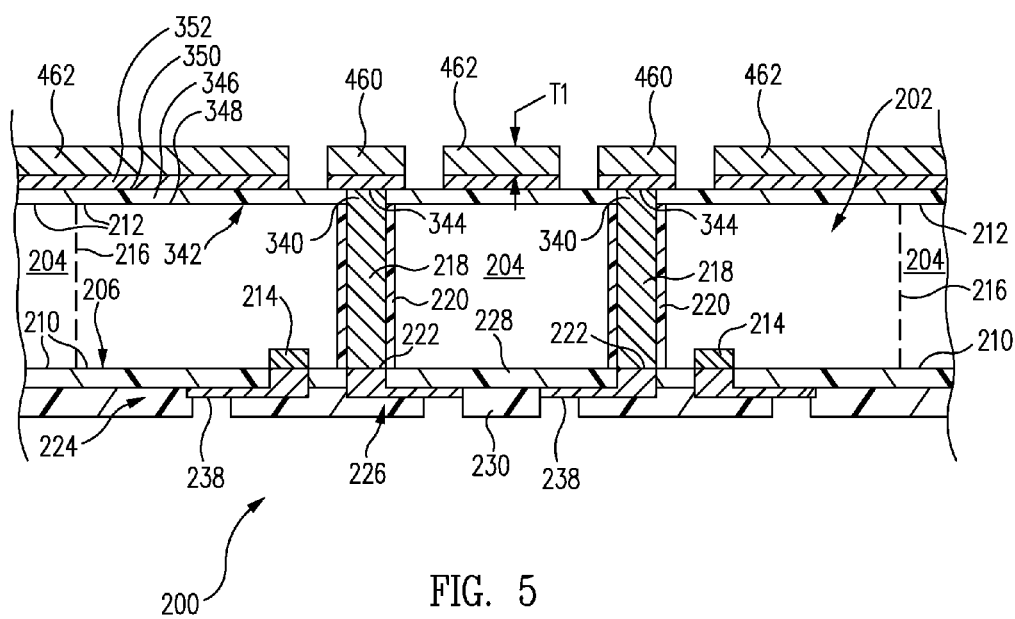

As an overview and in accordance with one embodiment, referring to FIG. 5, an array 200 includes a substrate 202 having a frontside surface 206 and a backside surface 342. Through vias 218 extend through substrate 202 between frontside surface 206 and backside surface 342, through vias 218 comprising active surface ends 222 at frontside surface 206.

A frontside redistribution structure 224 formed on frontside surface 206 and is coupled to active surface ends 222. Frontside redistribution structure 224 exerts force on frontside surface 206, e.g., due to a difference in the thermal coefficient of expansion (TCE) between frontside redistribution structure 224 and substrate 202.

To prevent warpage of substrate 202, a backside warpage control structure 462 is coupled to backside surface 342 of substrate 202. Backside warpage control structure 462 exerts an equal but opposite force to the force exerted by the frontside redistribution structure 224 thus avoiding warpage of substrate 202.

Figure 1:
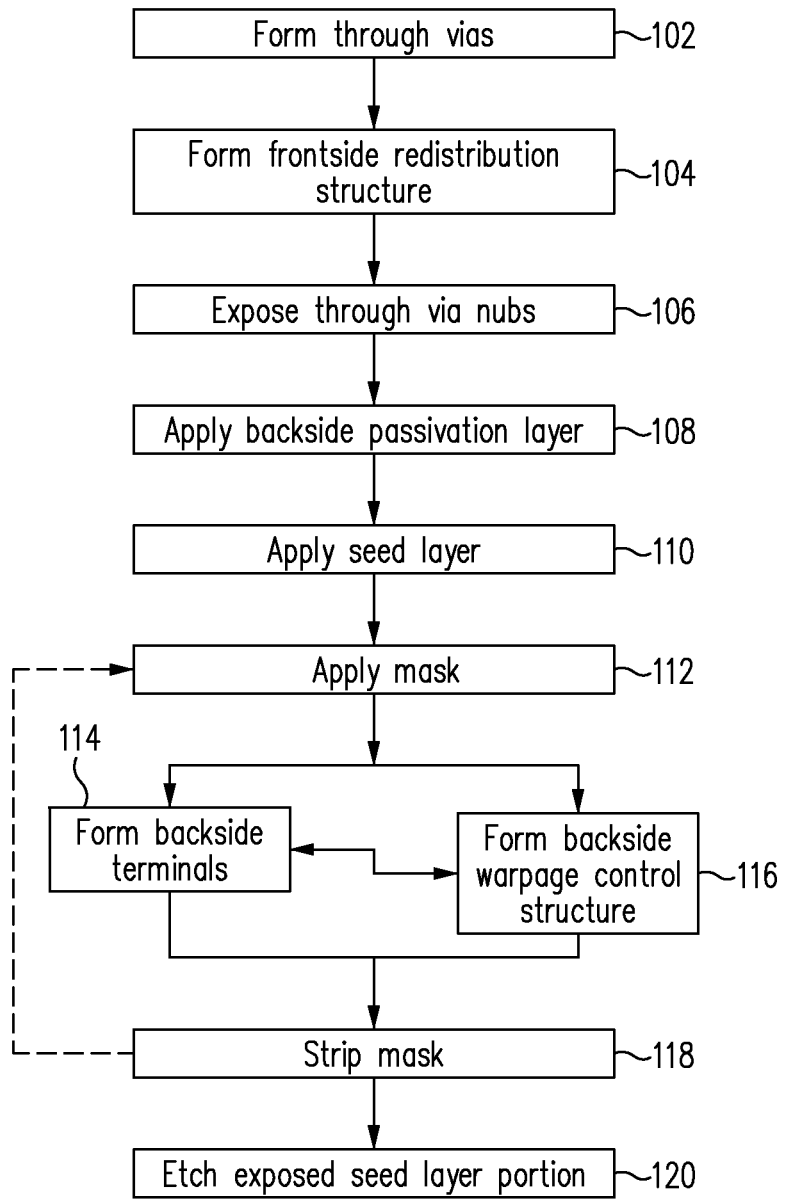
FIG. 1 is a block diagram of a backside warpage control structure fabrication method in accordance with one embodiment.
Figure 2:
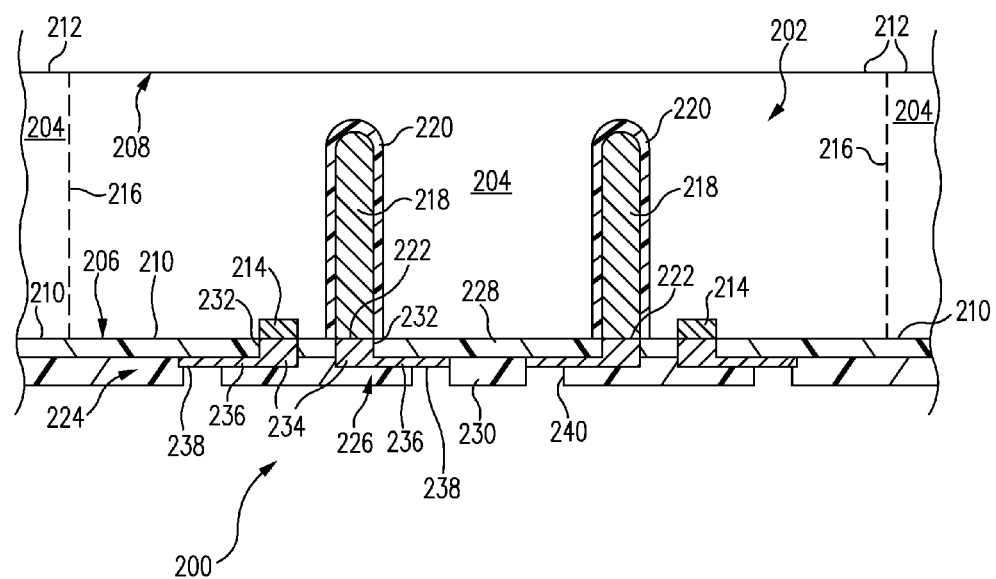
FIG. 2 is a cross-sectional view of an array including a substrate including a plurality of electronic components in accordance with one embodiment.

Now in more detail, FIG. 1 is a block diagram of a backside warpage control structure fabrication method 100 in accordance with one embodiment. FIG. 2 is a cross-sectional view of an array 200 including a substrate 202 including a plurality of electronic components 204 in accordance with one embodiment.

In one embodiment, substrate 202 is a silicon wafer. Substrate 202 includes a frontside, e.g., first, surface 206 and an opposite backside, e.g., second, surface 208.

Substrate 202 includes electronic components 204 integrally connected to one another. For simplicity, the term substrate 202 shall be used herein and it is to be understood that this term generally includes electronic components 204.

In one embodiment, electronic components 204 are integrated circuit chips, e.g., active components including active circuitry. However, in other embodiments, electronic components 204 are passive components such as capacitors, resistors, or inductors.

In accordance with this embodiment, electronic components 204 include active surfaces 210 and opposite inactive surfaces 212. Active surfaces 210 and inactive surfaces 212 generally define frontside surface 206 and backside surface 208 of substrate 202, respectively. For simplicity, the terms frontside surface 206 and backside surface 208 shall be used herein and it is to be understood that these terms generally include active surfaces 210 and inactive surfaces 212, respectively. Electronic components 204 further includes bond pads 214 formed on active surfaces 210.

Electronic components 204 are delineated from one another by singulation streets 216. Substrate 202 is singulated, e.g., sawed, along singulation streets 216 to separate packaged electronic components 204 from one another at a later stage during fabrication.

In another embodiment, array 200 includes a plurality of interposers 204 connected together (instead of electronic components 204). More particularly, interposers 204, e.g., silicon interposers, have an absence of active circuitry and thus do not have bond pads 214. The structure of array 200 when formed of interposers 204 is otherwise the same or similar to the structure of array 200 when formed of electronic components as discussed above. Array 200 including electronic components 204 (instead of interposers) shall be discussed below but it is to be understood that the discussion is equally applicable to the embodiment where array 200 is formed of interposers.

Referring now to FIGS. 1 and 2 together, in a form through vias operation 102, through vias 218 are formed in electronic components 104. Through vias 218 are surrounded by dielectric through via passivation linings 220.

Illustratively, through via apertures are formed, e.g., by laser drilling, into electronic components 104 from frontside surface 206. Through via passivation linings 220, e.g., silicon oxide ($SiO_2$), are formed on the sidewalls of the through via apertures. In one embodiment, the silicon of substrate 202 exposed within the through via apertures is oxidized to form through via passivation linings 220. In another embodiment, a dielectric material is deposited within the through via apertures to form through via passivation linings 220.

Through vias 218 are formed within through via passivation linings 220. Illustratively, an electrically conductive material, e.g., copper or tungsten, is deposited, e.g., plated, within through via passivation linings 220 to form through vias 218. Through via passivation linings 220 electrically isolate through vias 218 from substrate 202.

Through vias 218 include active surface ends 222. Active surface ends 222 are circular in accordance with this embodiment. Active surface ends 222 are coplanar with and parallel to frontside surface 206 of substrate 202.

From form through vias operation 102, flow moves to a form frontside redistribution structure operation 104. In form frontside redistribution structure operation 104, a frontside redistribution structure 224 is formed.

In accordance with this embodiment, frontside redistribution structure 224 includes a circuit pattern 226 and frontside dielectric layers 228, 230.

More particularly, frontside dielectric layer 228, sometimes called a first frontside dielectric layer, is formed on frontside surface 206 of substrate 202. In one embodiment, frontside dielectric layer 228 is a passivation layer formed on frontside surface 206 as provided from the manufacture of substrate 202, e.g., the wafer manufacturer. In another embodiment, frontside dielectric layer 228 is applied to frontside surface 206, e.g., is a separate layer of polyimide or other dielectric material that is applied to frontside surface 206.

Frontside dielectric layer 228 has via apertures 232 formed therein that exposed bond pads 214 and/or active surface ends 222 of through vias 218. Circuit pattern 226, e.g., copper or other electrically conductive material, includes electrically conductive vias 234 formed within via apertures 232. Vias 234 are in contact with and electrically connected to bond pads 214 and/or active surface ends 222 of through vias 218.

Circuit pattern 226 further includes traces 236, e.g., long thin connectors extending parallel to frontside surface 206. Traces 236 are formed on or embedded within frontside dielectric layer 228.

Traces 236 terminate in frontside terminals 238, sometimes called lands, of circuit pattern 226. Frontside dielectric layer 230, sometimes called a second frontside dielectric layer 230, is formed on circuit pattern 226 and frontside dielectric layer 228. In one embodiment, frontside dielectric layer 230 is a solder mask or other dielectric material.

Frontside dielectric layer 230 is patterned to form terminal openings 240 therein. Terminal openings 240 expose frontside terminals 238 of circuit pattern 226.

Generally, frontside redistribution structure 224 redistributes the pattern of bond pads 214 and/or active surface ends 222 to the pattern of frontside terminals 238. Although circuit pattern 226 is illustrated as a single layer conductor layer between frontside dielectric layers 228, 230, generally, frontside redistribution structure 224 includes multiple conductor layers and multiple dielectric layers. For example, frontside redistribution structure 224 includes seven conductor layers and associated dielectric layers in other embodiments.

Frontside redistribution structure 224 has a thermal coefficient of expansion (TCE) different than substrate 202 including electronic components 204. For example, frontside redistribution structure 224 includes copper and substrate 202 includes silicon, which have substantially different TCEs.

This mismatch in TCEs causes frontside redistribution structure 224 to exert stress on substrate 202 including electronic components 204. Absent a backside warpage control structure in accordance with one embodiment as discussed below, this stress would cause undesirable warpage of substrate 202 including electronic components 204.

Figure 3:
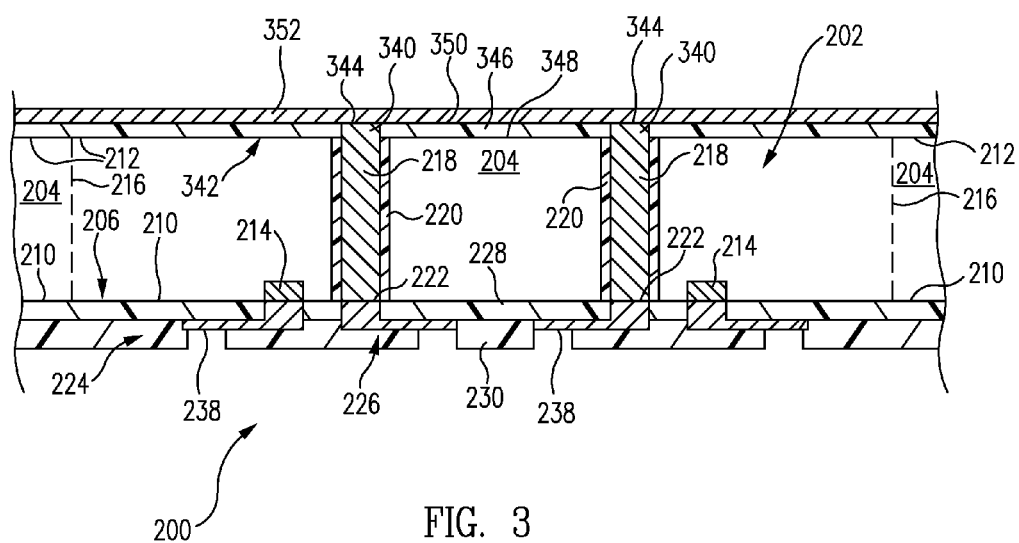
FIG. 3 is a cross-sectional view of the array of FIG. 2 at a later stage during fabrication in accordance with another embodiment.

FIG. 3 is a cross-sectional view of array 200 of FIG. 2 at a later stage during fabrication in accordance with one embodiment. Referring now to FIGS. 1, 2, and 3 together, from form frontside redistribution structure operation 104, flow moves to an expose through via nubs operation 106. In expose through via nubs operation 106, through via nubs 340 of through vias 218 are exposed.

In one embodiment, substrate 202 is thinned, sometimes called backgrinded, to expose through vias 218 at backside surface 208 of substrate 202. Backside surface 208 of substrate 202 is then blanket etched, i.e., removed, to expose through via nubs 340 of through vias 218. In one embodiment, backside surface 208 is removed using a selective etch that etches substrate 202, e.g., silicon, but does not etch through vias 218, e.g., copper. Optionally, the portion of through via passivation lining 220 covering the sides of through via nubs 340 is also removed.

Generally, in expose through via nubs operation 106, substrate 202 is thinned from backside surface 208. Stated another way, a portion of substrate 202 at backside surface 208 as illustrated in FIG. 2 is removed to form a recessed backside surface 342 as illustrated in FIG. 3. For example, a Si dry etch is performed to thin substrate 202.

Accordingly, after performance of expose through via nubs operation 106, substrate 102 includes a recessed backside surface 342. Inactive surfaces 212 generally define recessed backside surface 342. For simplicity, the term recessed backside surface 342 shall be used herein and it is to be understood that this term generally includes inactive surfaces 212.

However, through vias 218 are not thinned and thus through via nubs 340 are exposed as illustrated in FIG. 3. Through vias 218 are sometimes said to stand proud of or extend from recessed backside surface 342.

Through via nubs 340 are the upper portions of through vias 218 exposed and uncovered by substrate 202. Through via nubs 340 are cylindrical protrusions protruding upwards from recessed backside surface 342.

Through via nubs 340, e.g., first portions of through vias 218, include inactive surface ends 344, e.g., planar circular ends or curved ends. Inactive surface ends 344 are spaced above recessed backside surface 342.

Generally, through vias 218 are electrically conductive columns extending between active surface ends 222 and inactive surface ends 344.

In another embodiment, to expose through via nubs 340, substrate 202 is thinned, sometimes called backgrinded, to almost expose through vias 218 at backside surface 208 of substrate 202. More particularly, through vias 218 remain enclosed within substrate 202 at backside surface 208 in accordance with this embodiment. More particularly, except at frontside surface 206, through vias 218 are totally enclosed within through via passivation linings 220. Further, a portion of substrate 202, e.g., silicon, remains between through vias 218 and backside surface 208.

Backside surface 208 of substrate 202 is then blanket etched, i.e., removed, to expose through via nubs 340 of through vias 218. In one embodiment, backside surface 208 is removed using a selective etch that etches substrate 202, e.g., silicon, but does not etch through vias 218, e.g., copper. Then a selective etch to remove through via passivation linings 220, e.g., silicon oxide, exposed from recessed backside surface 342 is performed resulting in the structure as illustrated in FIG. 3. In accordance with this embodiment, inactive surface ends 344 may not be planar but may be curved surfaces.

From expose through via nubs operation 106, flow moves to an apply backside passivation layer operation 108. In apply backside passivation layer operation 108, a backside passivation layer 346 is applied to recessed backside surface 342.

Backside passivation layer 346, sometimes called an insulation layer, includes a lower, e.g., first, passivation layer surface 348 directly attached to recessed backside surface 342. Backside passivation layer 346 further includes an opposite upper, e.g., second, passivation layer surface 350. Backside passivation layer 346 is a dielectric material.

In one embodiment, backside passivation layer 346 is formed from an organic material such as polyimide (PI), polybutyloxide (PBO), benzocyclobutene (BCB), a polymer, or other carbon containing material. In one embodiment, backside passivation layer 346 is formed by spinning, or spraying an organic material onto recessed backside surface 342 or applying a laminated film. In other embodiments, backside passivation layer 346 is an inorganic material, e.g., silicon oxide or silicon nitride, formed using a plasma enhanced chemical vapor deposition (PECVD) deposition process.

Backside passivation layer 346 is patterned to expose inactive surface ends 344 of through vias 218.

From apply backside passivation layer operation 108, flow moves to an apply seed layer operation 110. In apply seed layer 110, a seed layer 352 is applied to upper passivation layer surface 350 of backside passivation layer 346 and inactive surface ends 344 of through vias 218. Seed layer 352 is an electrically conductive material which is blanket applied, e.g., by sputtering, or other application technique. Seed layer 352 is sometimes called an under bump metal (UBM).

Figure 4:
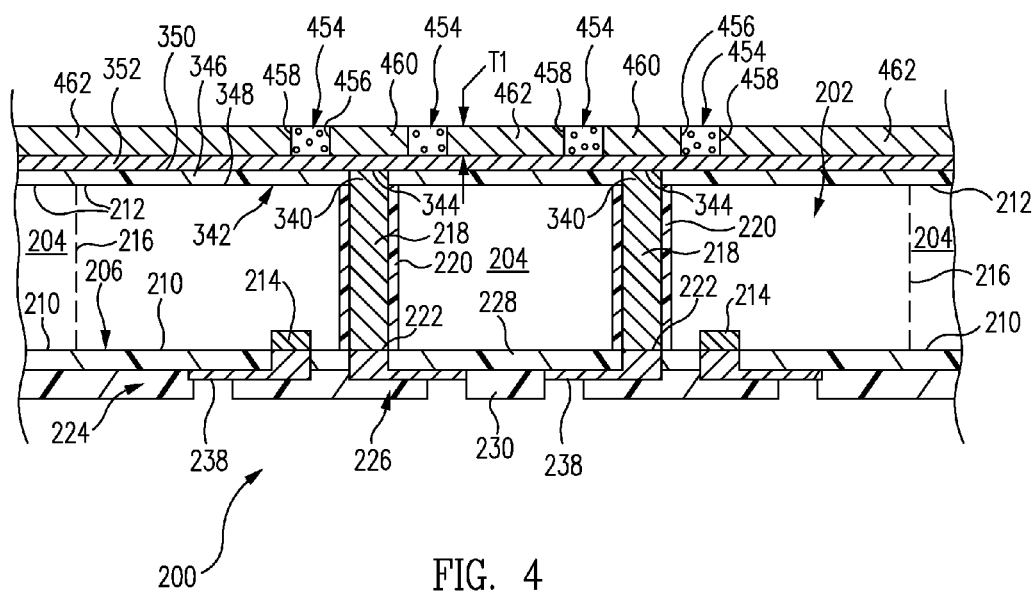
FIGS. 4 and 5 are cross-sectional views of the array of FIG. 3 at later stages during fabrication in accordance with various embodiments.

FIG. 4 is a cross-sectional view of array 200 of FIG. 3 at a later stage during fabrication in accordance with one embodiment. Referring now to FIGS. 1 and 4 together, from apply seed layer 110, flow moves to an apply mask operation 112.

In apply mask operation 112, a patterned mask 454 is applied to seed layer 352. In one embodiment, a resist is applied and patterned, e.g., using photolithography or laser ablation, to form patterned mask 454. In one specific embodiment, a photoresist is applied and a mask, e.g., formed of glass or mylar, is used to image a pattern of the photoresist to form patterned mask 454. Patterned mask 454 includes backside terminal artifacts 456 and warpage control structure artifact 458, i.e., patterned openings in patterned mask 454.

In one embodiment, backside terminal artifacts 456 are openings, e.g., a circular, rectangular, or other shaped opening, formed in patterned mask 454. Backside terminal artifacts 456 are openings extending though patterned mask 454 to expose seed layer 352 above inactive surface end 344 of through vias 218.

Warpage control structure artifact 458 is one or more openings formed in patterned mask 454. The pattern of warpage control structure artifact 458 depends upon the desired backside warpage control structure to be plated as discussed further below.

From apply mask operation 112, flow moves to a form backside terminals operation 114 and a form backside warpage control structure operation 116. In accordance with this embodiment, form backside terminals operation 114 and form backside warpage control structure operation 116 are both simultaneously performed.

In form backside terminals operation 114, backside terminals 460 are formed within backside terminal artifacts 456. Illustratively, backside terminal artifacts 456 are filled with an electrically conductive material to form backside terminals 460. In one embodiment, copper or another conductive material is plated within backside terminal artifacts 456 using seed layer 352 as a plating electrode to form backside terminals 460. Backside terminals 460 are sometimes called pads for backside ball/via lands.

In form backside warpage control structure operation 116, backside warpage control structure 462 is formed within warpage control artifact 458. Illustratively, warpage control artifact 458 is filled with an electrically conductive material to form backside warpage control structure 462. In one embodiment, copper or another conductive material is plated within warpage control artifact 458 using seed layer 352 as a plating electrode to form backside warpage control structure 462.

Illustratively, backside terminal artifacts 456 and warpage control artifact 458 are simultaneously filled with an electrically conductive material during a single plating operation. Thus, operations 114 and 116 are performed simultaneously to simultaneously form backside terminals 460 and backside warpage control structure 462. Accordingly, backside terminals 460 and backside warpage control structure 462 are formed of the same material, e.g., copper, and have the same thickness T1. Illustratively, thickness T1 is in the range of 4-10 μm although has other values in other embodiments.

FIG. 5 is a cross-sectional view of array 200 of FIG. 4 at a later stage during fabrication in accordance with one embodiment. Referring now to FIGS. 1, 4, and 5 together, from form backside terminals operation 114 and form backside warpage control structure operation 116, flow moves to a strip mask operation 118. In strip mask operation 118, patterned mask 454 is stripped, i.e., removed. Upon removal of patterned mask 454, portions of seed layer 352 that were covered by patterned mask 454 are exposed.

From strip mask operation 118, flow moves to an etch exposed seed layer portion operation 120. In etch exposed seed layer portion operation 120, the exposed portion of seed layer 352 that was exposed during performance of strip mask operation 118 is removed, e.g., using a flash etch, resulting in the structure as illustrated in FIG. 5.

As described above, backside warpage control structure 462 is formed simultaneously with backside terminals 460 using the same operations 110, 112, 116, 118, 120 that ordinarily would be performed to form backside terminals 460. Accordingly, the additional cost to form backside warpage control structure 462 is minimal.

Backside warpage control structure 462 matches the expansion and/or contraction of frontside redistribution structure 224. More particularly, as discussed above, frontside redistribution structure 224 exerts tension or compression on substrate 202 including electronic components 204, for example, due to a mismatch in TCEs between frontside redistribution structure 224 and substrate 202.

In one embodiment, frontside redistribution structure 224 exerts tension on substrate 202 by pushing the edges of substrate 202 upward relative to the center of substrate 202. Absent backside warpage control structure 462, this tension would cause the edges of substrate 202 to move upwards relative to the center of substrate 202 resulting in a smile configuration.

In contrast, in another embodiment, frontside redistribution structure 224 exerts compression on substrate 202 by pulling the edges of substrate 202 downwards relative to the center of substrate 202. Absent backside warpage control structure 462, this compression would cause the edges of substrate 202 to move downwards relative to the center of substrate 202 resulting in a cry configuration.

However, backside warpage control structure 462 exerts an equal but opposite force to the force exerted by frontside redistribution structure 224 on substrate 202 that prevents warpage of substrate 202 including electronic components 224.

More particularly, if frontside redistribution structure 224 exerts compression on substrate 202, backside warpage control structure 462 also exerts compression on substrate 202 equal to the compression exerted by frontside redistribution structure 224. However, since backside warpage control structure 462 is on recessed backside surface 342 whereas frontside redistribution structure 224 is on frontside surface 206, the equal compressive stresses are exerted on substrate 202 opposite one another. This prevents warpage of substrate 202.

In another embodiment, if frontside redistribution structure 224 exerts tension on substrate 202, backside warpage control structure 462 also exerts tension on substrate 202 equal to the tension exerted by frontside redistribution structure 224. However, since backside warpage control structure 462 is on recessed backside surface 342 whereas frontside redistribution structure 224 is on frontside surface 206, the equal tensile stresses are exerted on substrate 202 opposite one another. This prevents warpage of substrate 202, i.e., keeps substrate 202 planar.

After etch expose seed layer portion operation 120, in one embodiment, additional processing on array 200 is performed. For example, additional passivation or solder mask layers are formed. Further, array 200 is singulated along singulation streets 216 to form singulated electronic component packages.

Figure 7:
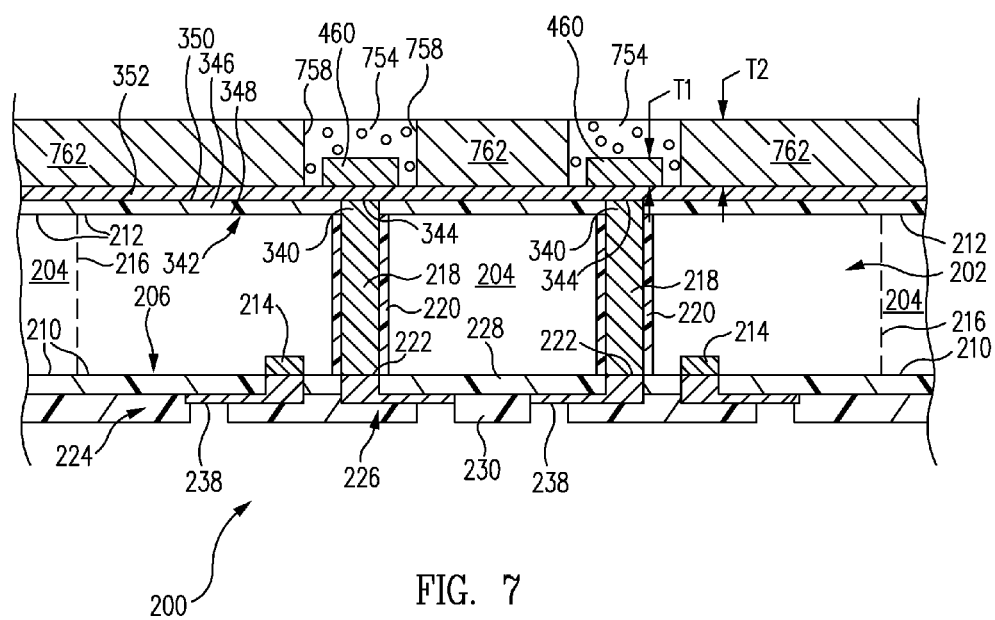
FIGS. 7 and 8 are cross-sectional views of the array of FIG. 6 at later stages during fabrication in accordance with various embodiments.
Figure 8:
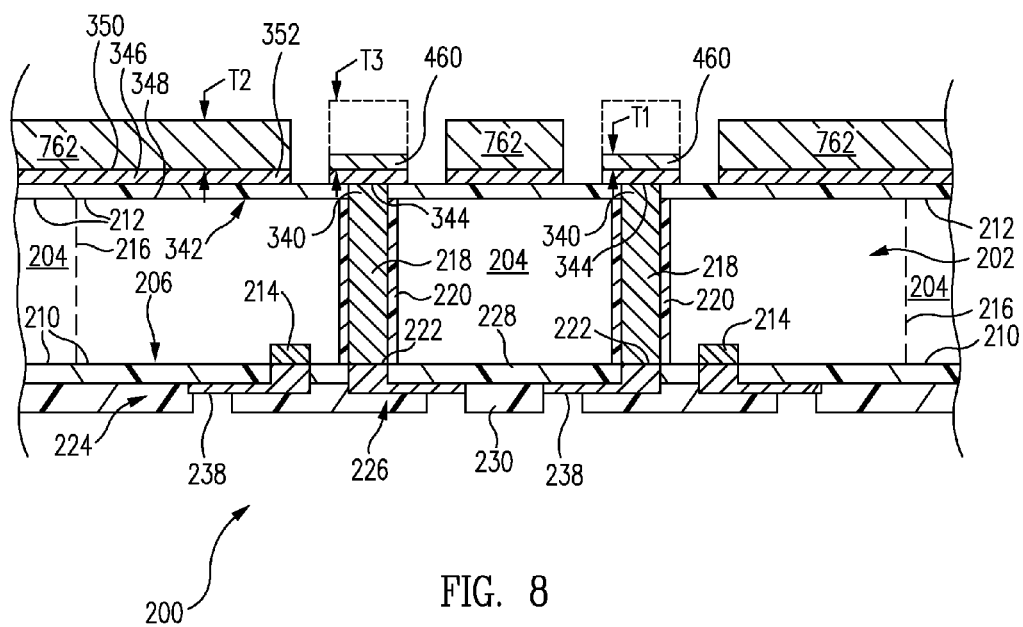

In another embodiment, a backside warpage control structure 762 (illustrated in FIGS. 7 and 8) is formed to be thicker, thinner, and/or of a different metal than backside terminals 460. Fabrication of such a backside warpage control structure 762 is illustrated in FIGS. 6, 7, 8 and discussed below.

Figure 6:
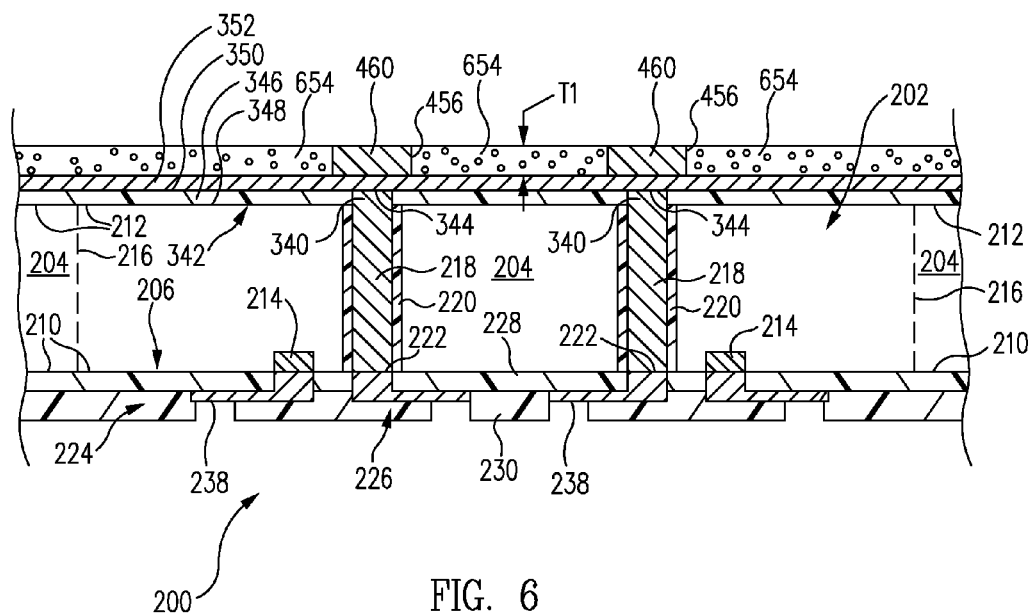
FIG. 6 is a cross-sectional view of the array of FIG. 3 at a later stage during fabrication in accordance with another embodiment.

FIG. 6 is a cross-sectional view of array 200 of FIG. 3 at a later stage during fabrication in accordance with another embodiment. Referring now to FIGS. 1, and 6 together, from apply seed layer operation 110 as discussed above, flow moves to apply mask operation 112.

In apply mask operation 112, a patterned mask 654 is applied to seed layer 352 in a manner similar to that discussed above regarding patterned mask 454. Patterned mask 654 includes backside terminal artifacts 456, i.e., patterned openings in patterned mask 654, as described above. Patterned mask 654 is sometimes called a first patterned mask.

From apply mask operation 112, flow moves to form backside terminals operation 114. In form backside terminals operation 114, backside terminals 460 are formed within backside terminal artifacts 456 as discussed above.

FIG. 7 is a cross-sectional view of array 200 of FIG. 6 at a later stage during fabrication in accordance with one embodiment. Referring now to FIGS. 1, 6, and 7 together, from form backside terminals operation 114, flow moves to strip mask operation 118. In strip mask operation 118, patterned mask 654 (FIG. 6) is stripped, i.e., removed.

From strip mask operation 118, flow returns to apply mask operation 112 as indicated by the dotted arrow at the left of FIG. 1. In apply mask operation 112, a patterned mask 754 is applied to seed layer 352 and covers and protects backside terminals 460 in a manner similar to that discussed above regarding patterned mask 454. Patterned mask 754 is sometimes called a second patterned mask.

Patterned mask 754 includes a warpage control artifact 758, i.e., a patterned opening in patterned mask 754, similar to warpage control artifact 458 as described above.

From apply mask operation 112, flow moves to form backside warpage control structure operation 116. In form backside warpage control structure operation 116, a backside warpage control structure 762 is formed within warpage control artifact 758. Illustratively, warpage control artifact 758 is filled with an electrically conductive material to form backside warpage control structure 762. In one embodiment, copper or another conductive material is plated within warpage control artifact 758 using seed layer 352 as a plating electrode to form backside warpage control structure 762.

Further, paying particular attention to FIGS. 6 and 7 together, in accordance with this embodiment, patterned mask 754 and backside warpage control structure 762 are thicker than backside terminals 460 and patterned mask 654. More particularly, patterned mask 654 and backside terminals 460 have first thickness T1 and patterned mask 754 and backside warpage control structure 762 have a second thickness T2. Thickness T2 of patterned mask 754 and backside warpage control structure 762 is greater than thickness T1 of patterned mask 654 and backside terminals 460.

FIG. 8 is a cross-sectional view of array 200 of FIG. 7 at a later stage during fabrication in accordance with one embodiment. Referring now to FIGS. 1, 7, and 8 together, from form backside warpage control structure operation 116, flow moves to strip mask operation 118.

In strip mask operation 118, patterned mask 754 is stripped, i.e., removed. Upon removal of patterned mask 754, a portion of seed layer 352 that was covered by patterned mask 754 is exposed.

From strip mask operation 118, flow moves to etch exposed seed layer portion operation 120. In etch exposed seed layer portion operation 120, the exposed portion of seed layer 352 that was exposed during performance of strip mask operation 118 is removed resulting in the structure as illustrated in FIG. 8

As described above, backside warpage control structure 762 is formed after formation of backside terminals 460 in this embodiment using separate patterned masks 654, 754 and separate plating operations.

In another embodiment, backside warpage control structure 762 is formed before formation of backside terminals 460 using separate patterned masks 654, 754 and separate plating operations. In either case, this allows backside warpage control structure 762 to be formed thinner, thicker, or of a different material than backside terminals 460.

In one embodiment, as illustrated in FIG. 8, backside terminals 460 have a thickness T1 and backside warpage control structure 762 has a thickness T2. Thickness T1 is less than thickness T2, i.e., backside terminals 460 are thinner than backside warpage control structure 762.

In another embodiment, backside terminals 460 as indicated by the dashed lines have a thickness T3. Thickness T3 is greater than thickness T2, i.e., backside terminals 460 are thicker than backside warpage control structure 762.

In another embodiment, by using patterned masks 654, 754 and separate plating operations, backside warpage control structure 762 is formed of a different material than backside terminals 460. For example, backside warpage control structure 762 includes an electrically conductive material, a non-conductive material, or other type of material that is different than the material, e.g., copper, of backside terminals 460.

By using different materials and/or thicknesses of backside warpage control structure 762, backside warpage control structure 762 can be designed to match the expansion and/or contraction of frontside redistribution structure 224.

In yet another embodiment, the pattern of a backside warpage control structure such as backside warpage control structure 462 of FIG. 5 or backside warpage control structure 762 of FIG. 8 is designed to match the expansion and/or contraction of frontside redistribution structure 224. Various examples are provided below for backside warpage control structure 462 of FIG. 5 although it is to be understood that the patterns are equally applicable to backside warpage control structure 762 of FIG. 8.

Figure 9:
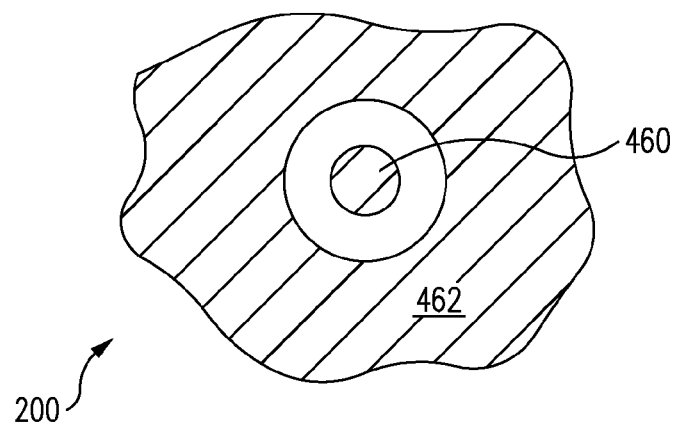
FIGS. 9, 10, 11 are top plan views of the array including a backside warpage control structure of FIG. 5 in accordance with one embodiment.

FIG. 9 is a top plan view of array 200 including backside warpage control structure 462 of FIG. 5 in accordance with one embodiment. Referring now to FIG. 9, in this embodiment, backside warpage control structure 462 is formed as a full metal everywhere except spaced apart from where backside terminals 460 are formed. Stated another way, backside warpage control structure 462 is a solid metal plane with exclusion of backside terminals 460, i.e., with a backside pad exclusion rule.

Figure 10:
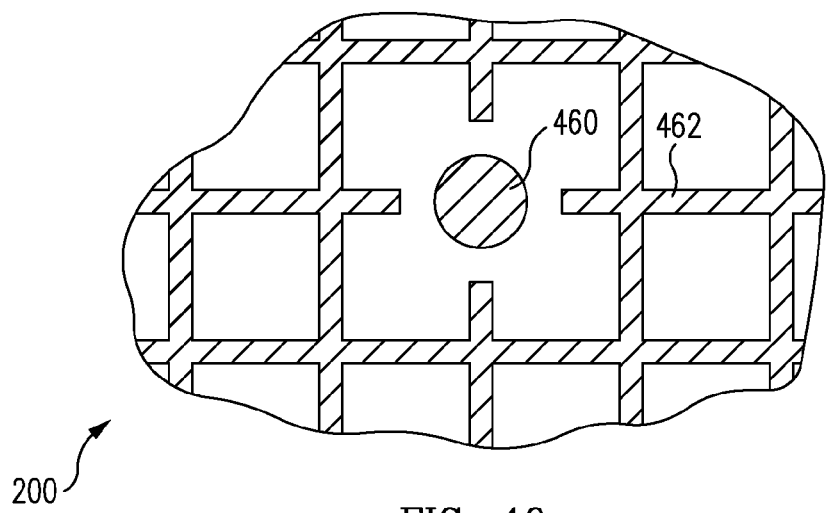

FIG. 10 is a top plan view of array 200 including backside warpage control structure 462 of FIG. 5 in accordance with another embodiment. Referring now to FIG. 10, in this embodiment, backside warpage control structure 462 is formed as a cross-hatch pattern.

Figure 11:
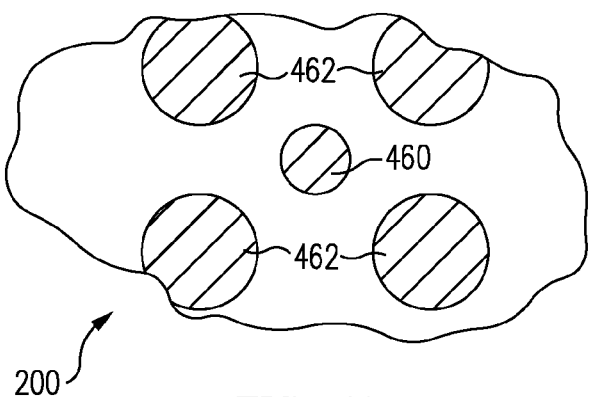

FIG. 11 is a top plan view of array 200 including backside warpage control structure 462 of FIG. 5 in accordance with another embodiment. Referring now to FIG. 11, in this embodiment, backside warpage control structure 462 is formed as a dot pattern, sometimes called a dot matrix.

Although particular patterns for backside warpage control structure 462 are illustrated and discussed above, generally, the pattern for backside warpage control structure 462 is selected to reduce or eliminate warpage from frontside redistribution structure 224. For example, backside warpage control structure 462 is not applied to corners of electronic components 204.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
    a substrate comprising:
        a frontside surface;
        a backside surface;
    a through via extending through the substrate between the frontside surface and the backside surface, the through via comprising an active surface end at the frontside surface;
    a frontside redistribution structure coupled to the active surface end, the frontside redistribution structure exerting force on the frontside surface;
    a backside passivation layer coupled to the backside surface;
    a seed layer coupled to the backside passivation layer;
    a backside terminal layer plated directly on the seed layer; and
    a backside warpage control structure consisting of an electrically conductive layer plated on the seed layer, the backside warpage control structure exerting an opposing force to counter the force exerted by the frontside redistribution structure
    where a thickness of the plated backside terminal layer is different from a thickness of the plated electrically conductive layer.

2. The structure of claim 1 wherein the backside warpage control structure exerts the force on the backside surface.

3. The structure of claim 1 wherein the substrate is an interposer having an absence of active circuitry.

4. The structure of claim 1 wherein the substrate comprises an electronic component having active circuitry, the electronic component comprising a bond pad coupled to and positioned at the frontside surface, the frontside redistribution structure being coupled to the bond pad.

5. The structure of claim 1 wherein the frontside redistribution structure redistributes the active surface end to a frontside terminal of the frontside redistribution structure.

6. The structure of claim 1 wherein:
    the backside terminal layer is plated on a terminal portion of the seed layer; and
    the terminal portion of the seed layer is planar.

7. The structure of claim 1, wherein the entire seed layer is planar.

8. The structure of claim 1 wherein the opposing force exerted by the backside warpage control structure is equal and opposite to the force exerted by the frontside redistribution structure.

9. The structure of claim 1 wherein the plated backside terminal layer has a thickness less than a thickness of the plated electrically conductive layer of the backside warpage control structure.

10. The structure of claim 1 wherein the plated backside terminal layer has a thickness greater than a thickness of the plated electrically conductive layer of the backside warpage control structure.

11. The structure of claim 1, wherein the plated backside terminal layer is plated of a same material, plated at a same thickness, and plated in a same process step as the plated electrically conductive layer of the backside warpage control structure.

12. The structure of claim 1 wherein the plated backside terminal layer is formed of a material different from a material of the plated electrically conductive layer of the backside warpage control structure.

13. A structure comprising:
    a substrate;
    a frontside redistribution structure coupled to a frontside surface of the substrate;
    a backside terminal coupled to a backside surface of the substrate;
    a patterned mask coupled to the backside surface, the patterned mask covering and protecting the backside terminal, the patterned mask comprising a warpage control artifact comprising an opening through the patterned mask in which at least a portion of a backside warpage control structure is formed; and
    the backside warpage control structure consisting of an electrically conductive material formed in the opening of the warpage control artifact.

14. The structure of claim 13 wherein the backside terminal has a thickness less than a thickness of the backside warpage control structure.

15. The structure of claim 13 wherein the backside terminal has a thickness greater than a thickness of the backside warpage control structure.

16. The structure of claim 13 wherein the backside terminal is formed of a material different than a material of the backside warpage control structure.

17. A method of forming a semiconductor device, the method comprising:
    forming a substrate;
    forming a frontside redistribution structure coupled to a frontside surface of the substrate;
    forming a backside terminal coupled to a backside surface of the substrate;
    forming a patterned mask coupled to the backside surface, the patterned mask covering and protecting the backside terminal, the patterned mask comprising a warpage control artifact comprising an opening through the patterned mask in which at least a portion of a backside warpage control structure is formed; and
    forming the backside warpage control structure comprising an electrically conductive material in the opening of the warpage control artifact.

18. The method of claim 17, wherein the backside terminal has a thickness less than a thickness of the backside warpage control structure.

19. The method of claim 17, wherein the backside terminal has a thickness greater than a thickness of the backside warpage control structure.

20. The method of claim 17, wherein the backside terminal is formed of a material different than a material of the backside warpage control structure.

* * * * *